(12) United States Patent
Xie (10) Patent No.: US 10,777,662 B2
(45) Date of Patent: Sep. 15, 2020

(54) THIN FILM TRANSISTOR AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Huafei Xie, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 32 days.

(21) Appl. No.: 15/741,116

(22) PCT Filed: Nov. 29, 2017

(86) PCT No.: PCT/CN2017/113533
§ 371 (c)(1),
(2) Date: Sep. 27, 2018

(87) PCT Pub. No.: WO2019/100425
PCT Pub. Date: May 31, 2019

(65) Prior Publication Data
US 2019/0157428 A1 May 23, 2019

(30) Foreign Application Priority Data
Nov. 22, 2017 (CN) .......................... 2017 1 1175832

(51) Int. Cl.
*H01L 21/00* (2006.01)
*H01L 29/66* (2006.01)
(Continued)

(52) U.S. Cl.
CPC .... *H01L 29/66742* (2013.01); *H01L 21/0234* (2013.01); *H01L 21/02057* (2013.01);
(Continued)

(58) Field of Classification Search
CPC ......... H01L 21/02057; H01L 21/02274; H01L 21/0234; H01L 21/28026; H01L 23/3171;
(Continued)

(56) References Cited

U.S. PATENT DOCUMENTS

2013/0082262 A1* 4/2013 Honda ................ H01L 29/51
257/57

FOREIGN PATENT DOCUMENTS

| CN | 102245531 A | 11/2011 |
|---|---|---|
| CN | 104576394 A | 4/2015 |
| CN | 106409916 A | 2/2017 |

* cited by examiner

*Primary Examiner* — Brook Kebede
(74) *Attorney, Agent, or Firm* — Hemisphere Law, PLLC; Zhigang Ma (57) ABSTRACT

The present disclosure provides a manufacturing method of a thin film transistor, including: selecting a substrate, and forming a bottom gate, a gate insulating layer and a source-drain above the selected substrate, wherein the bottom gate and the source-drain adopts a conductive metal oxide with an adjustable work function as a metal conducting electrode; rinsing and drying the source-drain of the selected substrate, and ozone cleaning dried source-drain for a predetermined time under a predetermined illumination condition, bombarding the source-drain with oxygen plasma for a period of time, forming an active layer made of a carbon material over the source-drain; forming a passivation layer over the active layer. The implementation of the disclosure can reduce the contact resistance and improve the performance of the carbon-based thin film transistor device by adjusting the (Continued)

work function of the contact surface between the conductive metal and the active layer.

20 Claims, 4 Drawing Sheets

(51) Int. Cl.
| | |
|---|---|
| *H01L 29/786* | (2006.01) |
| *H01L 21/02* | (2006.01) |
| *H01L 23/31* | (2006.01) |
| *H01L 21/28* | (2006.01) |
| *H01L 29/49* | (2006.01) |
| *H01L 29/45* | (2006.01) |
| *H01L 51/05* | (2006.01) |
| *H01L 29/16* | (2006.01) |
| *H01L 29/778* | (2006.01) |
| *H01L 51/00* | (2006.01) |

(52) U.S. Cl.
CPC .. *H01L 21/02274* (2013.01); *H01L 21/28026* (2013.01); *H01L 23/3171* (2013.01); *H01L 29/1606* (2013.01); *H01L 29/45* (2013.01); *H01L 29/4908* (2013.01); *H01L 29/66045* (2013.01); *H01L 29/778* (2013.01); *H01L 29/7869* (2013.01); *H01L 29/78648* (2013.01); *H01L 29/78684* (2013.01); *H01L 29/78696* (2013.01); *H01L 51/0554* (2013.01); *H01L 51/0018* (2013.01); *H01L 51/0045* (2013.01); *H01L 51/0048* (2013.01)

(58) Field of Classification Search
CPC ........... H01L 29/66742; H01L 29/1606; H01L 29/45; H01L 29/4908; H01L 29/66045; H01L 29/778; H01L 29/78648; H01L 29/78684; H01L 29/7869; H01L 29/78696; H01L 51/0554
USPC ......................................................... 438/149
See application file for complete search history.

THIN FILM TRANSISTOR AND MANUFACTURING METHOD THEREOF

RELATED APPLICATIONS

The present application is a National Phase of International Application Number PCT/CN2017/113533, filed Nov. 29, 2017, and claims the priority of China Application CN 201711175832.7, filed Nov. 22, 2017.

FIELD OF THE DISCLOSURE

The present disclosure relates to a thin film transistor technology field, and more particularly to a thin film transistor and a manufacturing method thereof.

BACKGROUND OF THE DISCLOSURE

The currently used amorphous silicon thin film transistors, IGZO (indium gallium zinc oxide) thin film transistors and the like are sensitive to light, due to the electrical properties of light drift and change occurs, so need to cover the active layer with opaque metal layer in the preparation process to reduce the impact of light, making the display device aperture ratio greatly reduced.

In view of carbon nanotubes and graphene and other carbon materials in the structure of carbon atoms were presented as carbon atoms to sp2 hybrid hexagonal ring structure of lamellar structure, has excellent electrical properties, mechanical properties and chemical stability, can be applied to high-frequency devices to improve the frequency response of the device range, can also replace the traditional silicon-based semiconductor devices, prepared into high mobility, transparent, flexible curly thin film transistor. Compared with traditional silicon-based semiconductors and other III-V series semiconductors, carbon materials such as carbon nanotubes and graphene have obvious advantages in the application of flexible transparent thin film transistors because of their advantages of high mobility, high optical transparency, long-term electrical stability and good mechanical bending properties.

However, in the production of thin film transistors, carbon materials such as carbon nanotubes and graphene are affected by factors such as preparation method, dispersion solvent, semiconductor purity, and film formation method, so that the work function of the active layer formed of carbon materials such as carbon nanotubes and graphene fluctuate between 4.2 eV and 5.2 eV. As we all know, the active layer is matched with the work function of the conductive metal. Reducing the contact resistance to form the ohmic contact is a guarantee for the excellent performance of the transistor device. However, the contact between the active layer formed by the carbon materials such as carbon nanotubes and graphene and the metal electrode is not perfect ohmic contact. For example, conductive metal such as metal titanium Ti, metal palladium Pd, metal gold Au and metal platinum Pt are brought into contact with the carbon nanotubes. Their work functions are close to those of the carbon nanotubes. Even though the contact resistance between the metal platinum Pt and the carbon nanotubes is the smallest, the potential barrier still exists. Therefore, using the same adjustable work function conductive metal oxide (work function between 4.0 eV~6.1 eV) for the work function matching is of great significance.

SUMMARY OF THE DISCLOSURE

The technical problem to be solved by the embodiments of the present disclosure is to provide a thin film transistor and a manufacturing method thereof, which can improve the performance of a carbon-based thin film transistor device by adjusting the work function of the contact surface between the conductive metal and the active layer, reducing the contact resistance.

In order to solve the above technical problem, the embodiments of the present disclosure provide a manufacturing method of a thin film transistor, wherein the method includes the following steps:

step S11, selecting a substrate, and forming a bottom gate, a gate insulating layer and a source-drain from bottom to top in sequence above the selected substrate, wherein the source-drain adopts a conductive metal oxide with an adjustable work function as a metal conducting electrode;

step S12, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment; and step S13, forming a passivation layer over the active layer after the preparation of the active layer is completed.

Wherein the step S11 specifically includes:
when a substrate made of a silicide is selected, depositing a layer of the conductive metal oxide having a thickness of first threshold on the substrate made of the selected silicide by radio frequency magnetron sputtering as the bottom gate, and using plasma enhanced chemical vapor deposition to deposit a layer of silicon dioxide having a thickness of second threshold as the gate insulating layer;

after the preparation of the gate insulating layer above the substrate made of the selected silicide is completed, depositing a layer of the conductive metal oxide having a thickness of third threshold by magnetron sputtering as the source-drain, then preparing a source-drain pattern by coating photoresist, exposing, etching and removing photoresist.

Wherein the step S12 specifically includes:
soaking and flushing the source-drain of the substrate made by the selected silicide with acetone, methanol and isopropanol; drying the rinsed source-drain with a certain concentration of nitrogen; ozone cleaning the dried source-drain for 60 seconds under ultraviolet light; bombarding the source-drain after the ozone cleaning by oxygen plasma for 60 seconds, before the active layer prepared from semiconductor carbon nanotubes or silicon carbide is formed into a film; soaking the source-drain after the oxygen plasma bombardment into a semiconductor carbon nanotube solution or the silicon carbide solution, so that a layer of thin film deposited thereon is taken out and baked at a certain temperature to obtain a carbon nanotube network-like thin film or a silicon carbide network-like thin film, then coating the photoresist on the carbon nanotube network-like thin film or the silicon carbide network-like thin film, and etching remaining portions of the carbon nanotube network-like thin film or the silicon carbide network-like thin film except for a channel portion of the transistor with oxygen ions, continuing to remove the photoresist above the channel portion of the transistor in the carbon nanotube network-like thin film or the silicon carbide network-like thin film to prepare a carbon nanotube channel or a silicon carbide channel film, so that an active layer prepared from semiconductor carbon nanotubes or silicon carbide is obtained.

Wherein the step S13 specifically includes;
covering a certain thickness of silicon dioxide over the active layer made of semiconductor carbon nanotubes or silicon carbide by a chemical vapor deposition method as a passivation layer, after the preparation of the active layer made of semiconductor carbon nanotubes or silicon carbide is completed.

Wherein the selected substrate is a transparent substrate made of quartz or glass, and a transparent bottom gate, a transparent gate insulating layer, a transparent source-drain, a transparent active layer and a transparent passivation layer are formed above the corresponding substrate; wherein
the transparent gate insulating layer and the transparent passivation layer are both made of a transparent insulating material including silicon dioxide, graphene oxide, silicon nitride, aluminum oxide and an organic transparent insulating material;
the transparent bottom gate and the transparent source-drain are made of a transparent conductive metal oxide with an adjustable work function as a metal conducting electrode, and the transparent conductive metal oxide includes indium tin oxide, aluminum zinc oxide, tin oxide fluoride, gallium zinc oxide and zinc tin oxide;
the transparent active layer is made of semiconductor carbon nanotube or silicon carbide.

Wherein the method further includes;
depositing a layer of the transparent conductive metal oxide having a thickness of seventh threshold as a transparent top gate by RF magnetron sputtering.

Correspondingly, an embodiment of the present disclosure further provides another manufacturing method of a thin film transistor, wherein the method includes the following steps:
step S21, selecting a substrate, and forming a bottom gate, a gate insulating layer and a source-drain from bottom to top in sequence above the selected substrate, wherein the source-drain adopts a conductive metal oxide with an adjustable work function as a metal conducting electrode;
step S22, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment;
step S23, forming a passivation layer over the active layer after the preparation of the active layer is completed.

Wherein the step S21 specifically includes:
placing a substrate made of a selected plastic in acetone and isopropanol, ultrasonic cleaning and then drying with nitrogen, when the substrate made of the plastic is selected;
forming a patterned photoresist on the selected plastic substrate by UV lithography and a conductive metal oxide with a thickness of fourth threshold deposited as the bottom gate by RF magnetron sputtering; patterning the bottom gate by de-photoresist, and then depositing a non-transparent insulating material with a thickness of fifth threshold as the gate insulating layer by atomic force deposition technique; and patterning the gate insulating layer through ultraviolet lithography and phosphoric acid wet-etching technology;
depositing a conductive metal oxide with a thickness of sixth threshold as the source-drain by magnetron sputtering, after the preparation of the gate insulating layer above the substrate made of the selected plastic is completed; wet-etching an exposing indium tin oxide with phosphoric acid, after the photoresist is coated and the photoresist on the coating is patterned by UV lithography; and preparing a source-drain pattern by removing the photoresist of the unexposed conductive metal oxide.

Wherein the step S22 specifically includes:
soaking and washing the source-drain of the substrate made of selected plastic with acetone, methanol and isopropanol; drying the washed source-drain with a nitrogen gas of a certain concentration; and ozone cleaning the dried source-drain for 60 seconds under ultraviolet light, before the active layer prepared from graphene is film-formed, bombarding the source-drain after the ozone cleaning with oxygen plasma for 60 seconds;
transforming graphene grown on a copper foil by polymethylmethacrylate onto the source-drain after the oxygen plasma bombardment to form a thin film, then coating the photoresist on the thin film formed by graphene and etching remaining portions of the thin film formed by graphene except for a channel portion of the transistor with oxygen ions, continuing to remove the photoresist above the channel portion of the transistor in the thin film formed by graphene, so that an active layer prepared from graphene was obtained.

Wherein the step S23 specifically includes:
covering a certain thickness of silicon dioxide by a chemical vapor deposition method on the active layer made of graphene as a passivation layer, after the preparation of the active layer made of graphene is completed.

Wherein the selected substrate is a transparent substrate made of transparent plastic, and a transparent bottom gate, a transparent gate insulating layer, a transparent source-drain, a transparent active layer and a transparent passivation layer are formed above the corresponding substrate; wherein,
the transparent gate insulating layer and the transparent passivation layer are both made of a transparent insulating material including silicon dioxide, graphene oxide, silicon nitride, aluminum oxide and an organic transparent insulating material;
the transparent bottom gate and the transparent source-drain are made of a transparent conductive metal oxide with an adjustable work function as a metal conducting electrode, and the transparent conductive metal oxide includes indium tin oxide, aluminum zinc oxide, tin oxide fluoride, gallium zinc oxide and zinc tin oxide;
the transparent active layer is made of graphene.

Wherein the method further includes;
depositing a transparent conductive metal oxide with a thickness of seventh threshold on the transparent passivation layer as a transparent top gate by RF magnetron sputtering.

Correspondingly, an embodiment of the present disclosure further provides a manufacturing method of a thin film transistor, wherein the method includes the following steps:
step S31, selecting a substrate, and forming a source-drain on the selected substrate; wherein the source-drain adopts a conductive metal oxide with an adjustable work function as a metal conducting electrode;
step S32, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment; and
step 33, sequentially forming a passivation layer and a top gate from bottom to top on the active layer, after the active layer is prepared.

Wherein the step S31 specifically includes:
when a substrate made of silicide is selected, depositing a layer of the conductive metal oxide having a thickness of third threshold on the substrate made of silicide by magnetron sputtering as the source-drain, then preparing a source-drain pattern by coating photoresist, exposing, etching and removing photoresist.

Wherein the step S32 specifically includes:
soaking and flushing the source-drain of the substrate made by the selected silicide with acetone, methanol and isopropanol; drying the rinsed source-drain with a certain concentration of nitrogen; ozone cleaning the dried source-drain for 60 seconds under ultraviolet light; bombarding the source-drain after the ozone cleaning by oxygen plasma for 60 seconds, before the active layer prepared from semiconductor carbon nanotubes or silicon carbide is formed into a film; soaking the source-drain after the oxygen plasma bombardment into a semiconductor carbon nanotube solution or the silicon carbide solution, so that a layer of thin film deposited thereon is taken out and baked at a certain temperature to obtain a carbon nanotube network-like thin film or a silicon carbide network-like thin film, then coating the photoresist on the carbon nanotube network-like thin film or the silicon carbide network-like thin film, and etching remaining portions of the carbon nanotube network-like thin film or the silicon carbide network-like thin film except for a channel portion of the transistor with oxygen ions, continuing to remove the photoresist above the channel portion of the transistor in the carbon nanotube network-like thin film or the silicon carbide network-like thin film to prepare a carbon nanotube channel or a silicon carbide channel film, so that an active layer prepared from semiconductor carbon nanotubes or silicon carbide is obtained.

Wherein the step S33 specifically includes:
after the preparation of the active layer made of semiconductor carbon nanotubes or silicon carbide is completed, covering a layer of silicon dioxide with a certain thickness over the active layer made of semiconductor carbon nanotubes or silicon carbide by a chemical vapor deposition method as a passivation layer, and using a radio frequency magnetron sputtering method to deposit a conductive metal oxide with a thickness of seventh threshold on the passivation layer as the top gate.

Wherein the selected substrate is a transparent substrate made of quartz or glass, and a transparent source-drain, a transparent active layer, a transparent passivation layer and a transparent top gate are formed above the corresponding substrate; wherein
the transparent passivation layer is made of transparent insulating material, the transparent insulating material includes silicon dioxide, graphene oxide, silicon nitride, aluminum oxide and organic transparent insulating material;
the transparent source-drain adopts a transparent conductive metal oxide with an adjustable work function as a metal conducting electrode;
the transparent active layer is made of semiconductor carbon nanotube or silicon carbide;
the transparent top gate adopts a transparent conducting metal oxide with adjustable or non-adjustable work function as a metal conducting electrode;
the transparent conductive metal oxide includes indium tin oxide, aluminum zinc oxide, tin oxide, gallium zinc oxide, and zinc tin oxide.

Wherein the step S31 further includes:
when a substrate made of plastic is selected, depositing a layer of the conductive metal oxide having a thickness of third threshold on the substrate made of plastic by magnetron sputtering as the source-drain, then preparing a source-drain pattern by coating photoresist, exposing, etching and removing photoresist.

Wherein the step S32 further includes;
soaking and washing the source-drain of the substrate made of selected plastic with acetone, methanol and isopropanol; drying the washed source-drain with a nitrogen gas of a certain concentration; and ozone cleaning the dried source-drain for 60 seconds under ultraviolet light; before the active layer prepared from graphene is film-formed, bombarding the source-drain after the ozone cleaning with oxygen plasma for 60 seconds;
transforming graphene grown on a copper foil by polymethylmethacrylate onto the source-drain after the oxygen plasma bombardment to form a thin film, then coating the photoresist on the thin film formed by graphene and etching remaining portions of the thin film formed by graphene except for a channel portion of the transistor with oxygen ions, continuing to remove the photoresist above the channel portion of the transistor in the thin film formed by graphene, so that an active layer prepared from graphene was obtained.

Wherein the step S33 further includes:
after the preparation of the active layer made of graphene is completed, covering a layer of silicon dioxide with a certain thickness on the active layer made of graphene by a chemical vapor deposition method as a passivation layer, and using a radio frequency magnetron sputtering method to deposit a conductive metal oxide with a thickness of seventh threshold on the passivation layer as a top gate.

Wherein the selected substrate is a transparent substrate made of transparent plastic, and a transparent source-drain, a transparent active layer, a transparent passivation layer and a transparent top gate are formed above the corresponding substrate;
the transparent passivation layer is made of transparent insulating material, the transparent insulating material includes silicon dioxide, graphene oxide, silicon nitride, aluminum oxide and organic transparent insulating material;
the transparent source-drain adopts a transparent conductive metal oxide with an adjustable work function as a metal conducting electrode;
the transparent active layer is made of graphene;
the transparent top gate adopts a transparent conducting metal oxide with adjustable or non-adjustable work function as a metal conducting electrode;
the transparent conductive metal oxide includes indium tin oxide, aluminum zinc oxide, tin oxide, gallium zinc oxide, and zinc tin oxide.

In the present disclosure, two steps of ozone cleaning and oxygen plasma treatment on the conductive layer of the metal oxide (i.e., the source-drain) are added in the mature process and process of the existing amorphous silicon thin film transistor, improving the surface work function of the conductive metal oxide to make good ohmic contact with the active layer of the carbon material so as to improve the performance of the carbon-based thin film transistor device, moreover, the present disclosure can be applied to the preparation of a non-transparent carbon-based material thin film transistor and also to the preparation of a fully transparent carbon-based material thin film transistor.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure. For those skilled in the art, other drawings based on these drawings are still within the scope of the present disclosure without any creative efforts.

DETAILED DESCRIPTION OF PREFERRED EMBODIMENTS

The preferred embodiments of the present disclosure are described below with reference to the accompanying drawings.

In order to make the objectives, technical solutions and advantages of the present disclosure clearer, the present disclosure will be further described in detail with reference to the accompanying drawings.

Figure 1:
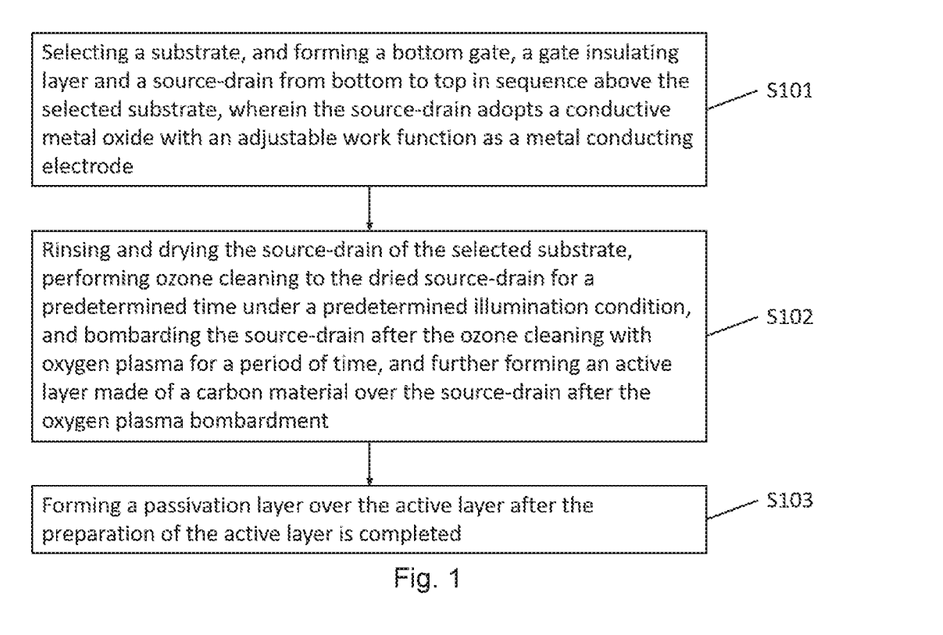
FIG. 1 is a flow chart of a manufacturing method of a thin film transistor according to Embodiment 1 of the present disclosure.

As shown in FIG. 1, FIG. 1 is a flow chart of a manufacturing method of a thin film transistor according to Embodiment 1 of the present disclosure. The method shows a method for preparing a non-fully transparent bottom gate structure carbon-based material thin film transistor, which includes the following steps:

step S101, selecting a substrate, and forming a bottom gate, a gate insulating layer and a source-drain from bottom to top in sequence above the selected substrate, wherein the source-drain adopts a conductive metal oxide with an adjustable work function as a metal conducting electrode;

step S102, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment;

step S103, forming a passivation layer over the active layer after the preparation of the active layer is completed.

The specific process is that in step S101, the selected substrate is made of non-transparent material; the gate insulating layer is made of a non-transparent insulating material and is processed through a plasma enhanced chemical vapor deposition method, an atomic force deposition technique, or other techniques. The bottom gate using conductive metal oxide or transparent conductive metal oxide as the metal conductive electrode and is processed through RF magnetron sputtering process. The source-drain using the adjustable work function conductive metal oxide or transparent conductive metal oxide as the metal conductive electrode and is processed through magnetron sputtering process.

According to the different substrate materials, the bottom gate, the gate insulating layer and the source-drain prepared by the above method also have different preparation methods as follows:

in one embodiment, a silicide substrate is first selected and a 100 nm conductive metal oxide or a transparent conductive metal oxide is deposited as a bottom gate on the silicide substrate by radio-frequency magnetron sputtering. Secondly, a 400 nm non-transparent insulating material is deposited by plasma enhanced chemical vapor deposition (using silane and oxygen as raw material gases) as a gate insulating layer. Then, a magnetron sputtering method is used to deposit a 100 nm conductive metal oxide or a transparent conductive metal oxide with an adjustable work function as a source-drain.

In another embodiment, the plastic substrate is first selected, the selected plastic substrate is placed in acetone and isopropanol, cleaned with ultrasonic and then blown dry with nitrogen. A patterned photoresist is formed on the selected plastic substrate by UV lithography, and a conductive metal oxide or a transparent conductive metal oxide with a thickness of 200 nm is deposited as a bottom gate by RF magnetron sputtering. The bottom gate is patterned by de-photoresist, then a 50 nm non-transparent insulating material is deposited as the gate insulating layer by the atomic force deposition technique, and the gate insulating layer is patterned by UV lithography and phosphoric acid wet-etching. A magnetron sputtering method is used to deposit a 100 nm conductive metal oxide or a transparent conductive metal oxide with an adjustable work function as a source-drain.

In step S102, the source-drain of the selected substrate are washed and rinsed with acetone, methanol and isopropanol, and the washed source-drain are purged with nitrogen at a certain concentration (for example, the concentration ratio is higher than 70%). Further, the dried source-drain was subjected to ozone cleaning for 60 seconds under ultraviolet light. Before the active layer was formed, the source-drain after the ozone cleaning were bombarded with oxygen plasma for 60 seconds. It should be noted that ozone cleaning and oxygen plasma treatment include oxygen plasma bath and injection. Oxygen plasma treatment can clean the organic impurities on the surface of the conductive metal oxide at the source-drain and at the same time increase the oxygen content at the surface of the conductive metal oxide at the source-drain and enhance the surface polarization so as to regulate the work function of the surface of the conductive metal oxide.

Wherein, the active layer is made of a carbon material, which includes the semiconducting carbon nanotubes, the graphene and the silicon carbide, and the specific method for preparing the active layer is as follows:

(1) when the semiconductor carbon nanotube or silicon carbide is used to prepare the active layer, immersing the source-drain after the oxygen plasma bombardment into a semiconductor carbon nanotube solution or the silicon carbide solution. So that a layer of thin film deposited thereon is taken out and baked at a certain temperature (for example, 150° C. for 30 minutes) to obtain a carbon nanotube network-like thin film or a silicon carbide network-like thin film. Then coating the photoresist on the carbon nanotube network-like thin film or the silicon carbide network-like thin film, and etching the remaining portions of the carbon nanotube network-like thin film or the silicon carbide network-like thin film except for the channel portion of the transistor with oxygen ions. Continuing to remove the carbon nanotube network-like film or silicon carbide network-like film in the channel above the transistor part of the photoresist. Preparing a channel of the carbon nanotube or a channel of the silicon carbide to obtain an active layer prepared from semiconductor carbon nanotubes or silicon carbide (the active layer may be adjusted to be transparent or non-transparent according to a process);

(2) when the active layer is prepared by using graphene, transferring the graphene grown on the copper foil onto the source-drain after oxygen plasma bombardment by polymethylmethacrylate transfer technology to form a thin film, then, applying photoresist over the thin film formed of graphene and etching the rest of the thin film formed by graphene with oxygen ions except for the channel portion of the transistor. Continuing to remove the photoresist layer above the channel portion of the transistor in the thin film formed by graphene to obtain an active layer made of graphene. The active layer can be adjusted to be transparent or non-transparent according to a process.

In step S103, above the active layer made of one of the semiconducting carbon nanotubes, silicon carbide and graphene, a layer of silicon dioxide with a certain thickness (for example, 500 nm) is covered by a chemical vapor deposition method as a passivation layer.

Figure 2:
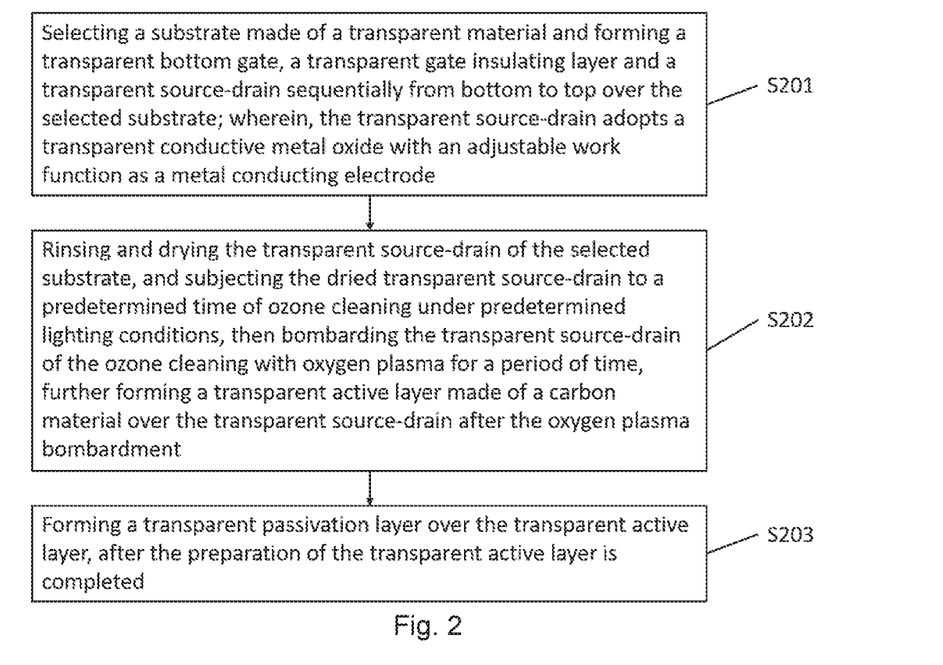
FIG. 2 is a flow chart of another manufacturing method of a thin film transistor according to Embodiment 2 of the present disclosure.

As shown in FIG. 2, a manufacturing method of a thin film transistor according to Embodiment 2 of the present disclosure is shown. The method shows a method for preparing a fully transparent bottom gate structure carbon-based material thin film transistor. The method includes the following steps:

step S201, selecting a substrate made of a transparent material and forming a transparent bottom gate, a transparent gate insulating layer and a transparent source-drain sequentially from bottom to top over the selected substrate; wherein, the transparent source-drain adopts a transparent conductive metal oxide with an adjustable work function as a metal conducting electrode;

step S202, rinsing and drying the transparent source-drain of the selected substrate, and subjecting the dried transparent source-drain to a predetermined time of ozone cleaning under predetermined lighting conditions, then bombarding the transparent source-drain of the ozone cleaning with oxygen plasma for a period of time, further forming a transparent active layer made of a carbon material over the transparent source-drain after the oxygen plasma bombardment;

step S203, forming a transparent passivation layer over the transparent active layer, after the preparation of the transparent active layer is completed.

The specific process is that, in step S201, the transparent material of the substrate includes quartz, glass and transparent plastic; the bottom gate also adopts the transparent conductive metal oxide with the same work function as the transparent source-drain as the metal conducting electrode and the transparent conducting metal oxide includes indium tin oxide, aluminum zinc oxide, tin oxide fluoride, gallium zinc oxide and zinc tin oxide. The transparent gate insulating layer is made of transparent insulating material, and the transparent insulating material includes silicon dioxide, graphene oxide, silicon nitride, aluminum oxide and organic transparent insulating material.

The substrate with different materials, the corresponding manufacturing method of the transparent bottom gate, the transparent gate insulating layer and the transparent source-drain formed from bottom to top in sequence are different as follows:

in one embodiment, when a substrate made of quartz or glass is selected, using radio frequency magnetron sputtering on the selected quartz or glass substrate to deposit a layer of indium tin oxide having a thickness of the first threshold (e.g. 100 nm) as a transparent bottom gate, and using plasma enhanced chemical vapor deposition (using silane and oxygen as raw material gases) to deposit a layer of silicon dioxide with the second threshold (e.g. 400 nm) in thickness as a transparent gate insulating layer;

after the preparation of the transparent gate insulating layer above the substrate made of selected quartz or glass is completed, depositing a layer of indium tin oxide with a thickness of the third threshold (e.g. 500 nm) as a transparent source-drain by magnetron sputtering, and preparing transparent source-drain patterns by coating photoresist, exposing, etching and removing photoresist.

In another embodiment, when a substrate made of transparent plastic material is selected, placing a substrate made of the selected transparent plastic material in acetone and isopropyl alcohol and ultrasonically cleaning and then blown drying with nitrogen gas;

a patterned photoresist is formed by UV lithography over a substrate of selected transparent plastic, and depositing a layer of indium tin oxide with a thickness of the fourth threshold (e.g. 200 nm) as a transparent bottom gate by RF magnetron sputtering, then, patterning the transparent bottom gate by de-photoresist, depositing a layer of aluminum oxide with a thickness of the fifth threshold (e.g. 50 nm) by atomic force deposition as the transparent gate insulating layer, the transparent gate insulating layer is patterned by ultraviolet lithography and phosphoric acid wet-etching technology.

After the preparation of the transparent gate insulating layer above the substrate made of the selected transparent plastic is completed, depositing a layer of indium tin oxide with a thickness of the sixth threshold (e.g. 500 nm) as a transparent source-drain by magnetron sputtering. After coating the photoresist and patterning the photoresist by UV lithography, exposing the indium tin oxide by wet-etching with phosphoric acid, the unexposed indium tin oxide is further de-photoed to prepare transparent source-drain patterns.

In step S202, the transparent source-drain of the selected substrate are rinsed with acetone, methanol and isopropanol and the cleaned source-drain is dried with a nitrogen concentration of a certain concentration (a concentration higher than 70%). Further, the cleaned source-drain was subjected to ozone cleaning for 60 seconds under ultraviolet light. Before the transparent active layer was formed, the transparent source-drain after ozone cleaning was bombarded with oxygen plasma for 60 seconds. It should be noted that ozone cleaning and oxygen plasma treatment include oxygen plasma bath and injection. Oxygen plasma treatment can clean the organic impurities on the surface of the conductive metal oxide at the source-drain and at the same time increase the oxygen content at the surface of the transparent conductive metal oxide at the source-drain and enhance the surface polarization so as to regulate the work function of the surface of the transparent conductive metal oxide.

The transparent active layer is made of a carbon material, which includes the semiconducting carbon nanotubes, the graphene and the silicon carbide. The specific method for preparing the active layer is as follows:

(1) when the transparent active layer is prepared by using the semiconducting carbon nanotubes or the silicon carbide, immersing the transparent source-drain after the oxygen plasma bombardment into the semiconducting carbon nanotube solution or the silicon carbide solution. So that a layer of thin film deposited thereon is taken out and baked at a certain temperature (for example, 150° C., for 30 minutes) to obtain a carbon nanotube network-like thin film or a silicon carbide network-like thin film, then coating the photoresist on the carbon nanotube network-like thin film or the silicon carbide network-like thin film, and etching the remaining portions of the carbon nanotube network-like thin film or the silicon carbide network-like thin film except for the channel portion of the transistor with oxygen ions, continuing to remove the carbon nanotube network-like thin film or silicon carbide network-like thin film in the channel above the transistor part of the photoresist, and preparing a carbon nanotube channel or a silicon carbide channel film to obtain a transparent active layer prepared from semiconductor carbon nanotubes or silicon carbide;

(2) when graphene is used to prepare the transparent active layer, transferring the graphene grown on the copper foil to a transparent source-drain after oxygen plasma bombardment by polymethylmethacrylate transfer technology to form a thin film, then applying photoresist over the thin film formed of graphene and etching the rest of the thin film formed by graphene with oxygen ions except for the channel portion of the transistor, continuing to remove the photoresist over the channel portion of the transistor in the thin film of graphene, and obtaining a transparent active layer prepared from graphene.

In step S203, above the transparent active layer made of one of the semiconducting carbon nanotubes, silicon carbide and graphene, a transparent passivation layer is covered by a chemical vapor deposition method of a certain thickness (e.g. 500 nm) of silicon dioxide; the transparent passivation layer is also made of the same transparent insulating material as the transparent insulating gate layer.

Figure 3:
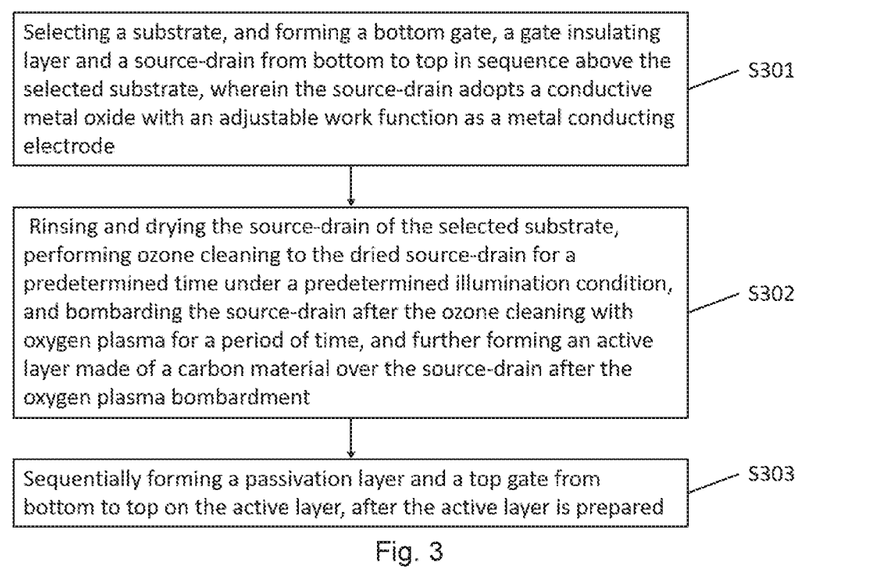
FIG. 3 is a flow chart of the other manufacturing method of a thin film transistor according to Embodiment 3 of the present disclosure.

As shown in FIG. 3, Embodiment 3 of the present disclosure provides a manufacturing method of a thin film transistor, which shows a manufacturing method of a non-fully transparent double-gate structure carbon-based material thin film transistor. The method includes the following steps:

step S301, selecting a substrate, and forming a bottom gate, a gate insulating layer and a source-drain from bottom to top in sequence above the selected substrate, wherein the source-drain adopts a conductive metal oxide with an adjustable work function as a metal conducting electrode;

step S302, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment; and step S303, sequentially forming a passivation layer and a top gate from bottom to top on the active layer, after the active layer is prepared.

Corresponding to the manufacturing method of a thin film transistor in Embodiment 1 of the present disclosure, the manufacturing method of a thin film transistor in Embodiment 2 of the present disclosure adds the manufacturing process of the top gate. The preparation process of the top gate is the same as that of the bottom gate. For example, a layer of indium tin oxide with a thickness of 100 nm is deposited as a top gate by RF magnetron sputtering. The preparation process of the substrate, the bottom gate, the gate insulating layer, the source-drain, the active layer and the passivation layer of the manufacturing method of a thin film transistor of Embodiment 2 of the present disclosure is the same as that of the substrate, the bottom gate, the gate insulating layer, the source-drain, the active layer and the passivation layer of the manufacturing method of a thin film transistor of Embodiment 1 of the present disclosure. Therefore, for the preparation process of the specific substrate, the bottom gate, the gate insulating layer, the source-drain, the active layer and the passivation layer, reference may be made to the related content in Embodiment 1 of the present disclosure, and details are not described herein again.

Figure 4:
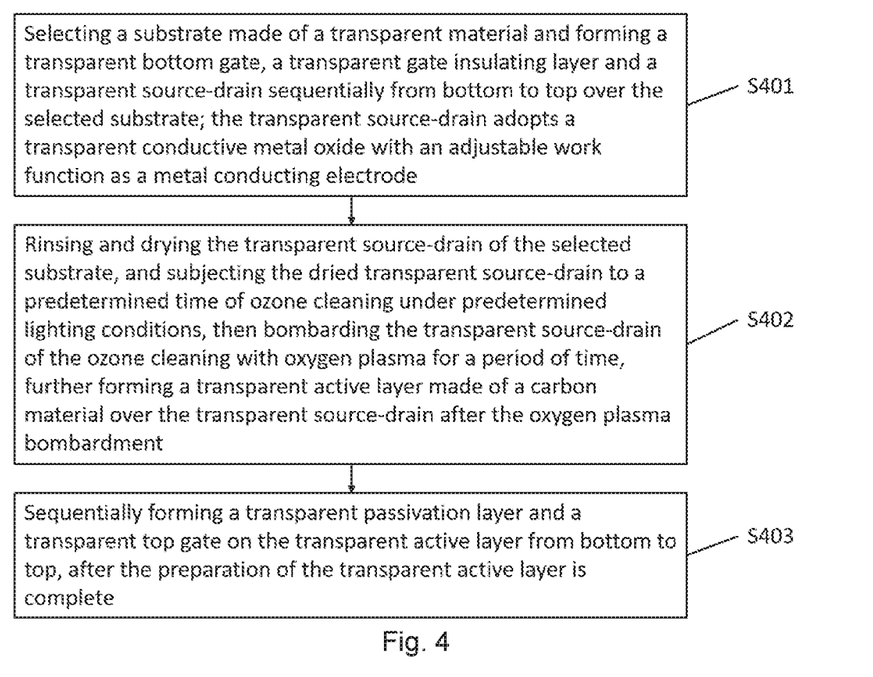
FIG. 4 is a flow chart of the other manufacturing method of a thin film transistor according to Embodiment 4 of the present disclosure.

As shown in FIG. 4, a manufacturing method of a thin film transistor according to a fourth embodiment of the present disclosure is shown. The method shows a manufacturing method of a full-transparent double-gate structure carbon-based material thin film transistor. The method includes the following steps: step S401, selecting a substrate made of a transparent material and forming a transparent bottom gate, a transparent gate insulating layer and a transparent source-drain sequentially from bottom to top over the selected substrate; the transparent source-drain adopts a transparent conductive metal oxide with an adjustable work function as a metal conducting electrode;

step S402, rinsing and drying the transparent source-drain of the selected substrate, and subjecting the dried transparent source-drain to a predetermined time of ozone cleaning under predetermined lighting conditions, then bombarding the transparent source-drain of the ozone cleaning with oxygen plasma for a period of time, further forming a transparent active layer made of a carbon material over the transparent source-drain after the oxygen plasma bombardment;

step S403, sequentially forming a transparent passivation layer and a transparent top gate on the transparent active layer from bottom to top, after the preparation of the transparent active layer is complete.

Wherein, the transparent top gate is made of a transparent conductive metal oxide as a metal conducting electrode.

Corresponding to the manufacturing method of a thin film transistor of Embodiment 2 of the present disclosure, the manufacturing method of a thin film transistor of Embodiment 4 of the present disclosure adds the preparation process of the transparent top gate. The preparation process of the transparent top gate is the same as that of the transparent bottom gate. For example, a layer of indium tin oxide with a thickness of the seventh threshold (e.g. 100 nm) is deposited as a transparent top gate by RF magnetron sputtering. The preparation process of the substrate, the transparent bottom gate, the transparent gate insulating layer, the transparent source-drain, the transparent active layer and the transparent passivation layer of the manufacturing method of a thin film transistor of Embodiment 4 of the present disclosure is the same as that of the substrate, the transparent bottom gate, the transparent gate insulating layer, the transparent source-drain, the transparent active layer and the transparent passivation layer of the manufacturing method of a thin film transistor of Embodiment 2 of the present disclosure. Therefore, for the preparation process of the specific substrate, the transparent bottom gate, the transparent gate insulating layer, the transparent source-drain, the transparent active layer and the transparent passivation layer, reference may be made to the related content in Embodiment 2 of the present disclosure, and details are not described herein again.

Figure 5:
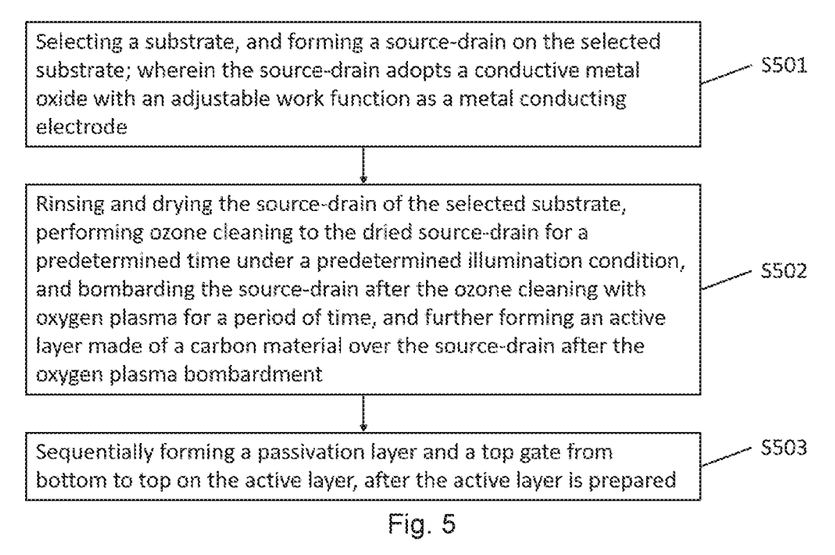
FIG. 5 is a flow chart of the other manufacturing method of a thin film transistor according to Embodiment 5 of the present disclosure.

As shown in FIG. 5, which is a manufacturing method of a thin film transistor according to Embodiment 5 of the present disclosure, the method shows a manufacturing method of a non-fully transparent top gate structure carbon-based material thin film transistor, and specifically includes the following steps: step S501, selecting a substrate, and forming a source-drain on the selected substrate; wherein the source-drain adopts a conductive metal oxide with an adjustable work function as a metal conducting electrode;

step S502, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment; and step S503, sequentially forming a passivation layer and a top gate from bottom to top on the active layer, after the active layer is prepared.

Corresponding to the manufacturing method of a thin film transistor of Embodiment 3 of the present disclosure, the manufacturing method of a thin film transistor of Embodiment 5 of the present disclosure omits the preparation process of the bottom gate and the insulating gate layer. The preparation process of the active layer, the passivation layer and the top gate in the manufacturing method of a thin film transistor of Embodiment 5 of the present disclosure corresponds to the active layer, the passivation layer and the top gate in the manufacturing method of a thin film transistor of Embodiment 3 of the present disclosure. Therefore, for the preparation process of the specific active layer, the passivation layer and the top gate, reference may be made to the related content in Embodiment 3 of the present disclosure, and details are not described herein again.

However, in step S501, the source-drain is directly prepared on the substrate. Due to the different substrate materials, the source-drain prepared above are also prepared differently according to the following method:

in one embodiment, a silicide (e.g. quartz, glass) substrate is selected, and depositing a conductive metal oxide or a transparent conductive metal oxide with an adjustable work function to a certain thickness (e.g. 100 nm) on the silicide substrate by using a radio frequency magnetron sputtering method as a drain-source.

In another embodiment, a plastic substrate is selected, the selected plastic substrate is placed in acetone and isopropanol, washed with nitrogen and then ultrasonically cleaned; a patterned photoresist is formed over the selected plastic substrate by UV lithography, and a radio frequency magnetron sputtering method is used for depositing a conductive metal oxide or a transparent conductive metal oxide with an adjustable work function to a certain thickness (e.g. 500 nm) as a source-drain. After coating the photoresist and patterning the photoresist by UV lithography, exposing the indium tin oxide by wet-etching with phosphoric acid, the unexposed conductive metal oxide or the transparent conductive metal oxide is further de-photoresist to prepare source-drain patterns.

Figure 6:
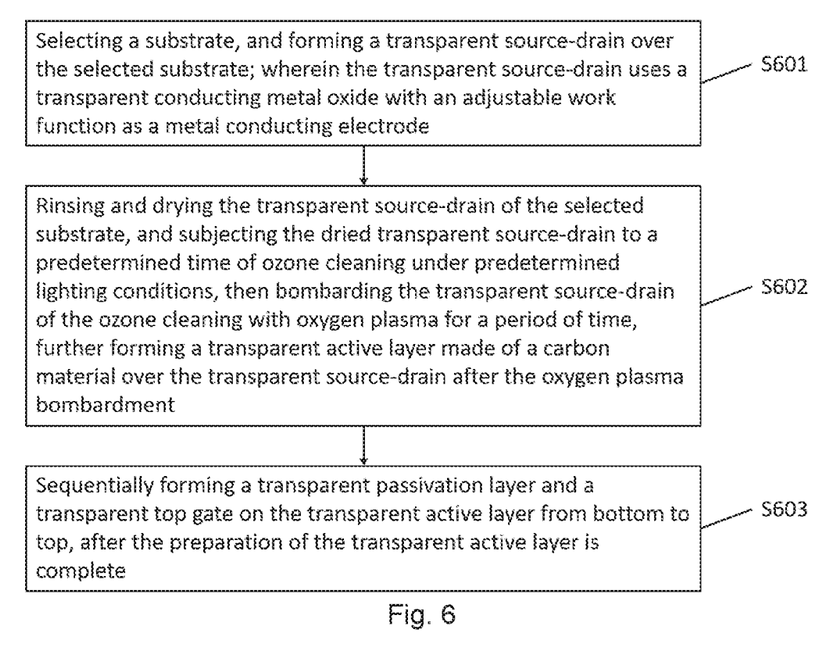
FIG. 6 is a flow chart of the other manufacturing method of a thin film transistor according to Embodiment 6 of the present disclosure.

As shown in FIG. 6, which is a manufacturing method of a thin film transistor according to Embodiment 6 of the present disclosure, the method shows a manufacturing method of a fully transparent top gate structure carbon-based material thin film transistor, and specifically includes the following steps:

step S601, selecting a substrate, and forming a transparent source-drain over the selected substrate; wherein the transparent source-drain uses a transparent conducting metal oxide with an adjustable work function as a metal conducting electrode;

step S602, rinsing and drying the transparent source-drain of the selected substrate, and subjecting the dried transparent source-drain to a predetermined time of ozone cleaning under predetermined lighting conditions, then bombarding the transparent source-drain of the ozone cleaning with oxygen plasma for a period of time, further forming a transparent active layer made of a carbon material over the transparent source-drain after the oxygen plasma bombardment;

step S603, sequentially forming a transparent passivation layer and a transparent top gate on the transparent active layer from bottom to top, after the preparation of the transparent active layer is complete.

Corresponding to the manufacturing method of a thin film transistor of Embodiment 4 of the present disclosure, the manufacturing method of a thin film transistor of Embodiment 6 of the present disclosure omits the preparation process of the transparent bottom gate and the transparent insulating gate layer. The manufacturing process of the substrate, the transparent source-drain, the transparent active layer, the transparent passivation layer and the transparent top gate in the manufacturing method of a thin film transistor of Embodiment 6 of the present disclosure is the same as that of the substrate, the transparent source-drain, the transparent active layer, the transparent passivation layer and the transparent top gate in the manufacturing method of the thin film transistor of Embodiment 4 of the present disclosure. Therefore, for the preparation process of the specific substrate, the transparent source-drain, the transparent active layer, the transparent passivation layer and the transparent top gate, reference may be made to the related content in Embodiment 4 of the present disclosure, and details are not described herein again.

However, in step S601, the transparent source-drain are directly prepared on the substrate. Due to the different substrate materials, the transparent source-drain prepared above is also prepared differently according to different preparation methods as follows:

in one embodiment, when a substrate made of quartz or glass is selected, a selected layer of indium tin oxide with a thickness of the eighth threshold (e.g. 500 nm) is deposited on the substrate made of quartz or glass by radio frequency magnetron sputtering as a transparent source-drain. Then, the transparent source-drain pattern is prepared by coating a photoresist, exposing, etching, and removing photoresist.

In another embodiment, when a substrate made of transparent plastic material is selected, a substrate made of the selected transparent plastic material is placed in acetone and isopropyl alcohol and ultrasonically cleaned and then dried with nitrogen gas. A patterned photoresist is formed by UV lithography over a substrate of selected transparent plastic, and a layer of indium tin oxide with a thickness of the ninth threshold (for example, 500 nm) is deposited as a transparent source-drain by RF magnetron sputtering. After coating the photoresist and patterning the photoresist by UV lithography, exposing the indium tin oxide by wet-etching with phosphoric acid, the unexposed indium tin oxide is further de-photoresist to prepare transparent source-drain patterns.

Understandably, a layer of indium tin oxide with a thickness of the tenth threshold (e.g. 500 nm) is deposited as a transparent top gate by RF magnetron sputtering.

Corresponding to the manufacturing method of a thin film transistor of Embodiment 1 of the present disclosure, Embodiment 7 of the present disclosure provides a thin film transistor, which is prepared by the manufacturing method of a thin film transistor of Embodiment 1 of the present disclosure. The thin film transistor is a carbon-based material thin film transistor with a non-fully-transparent bottom gate structure.

Figure 7:
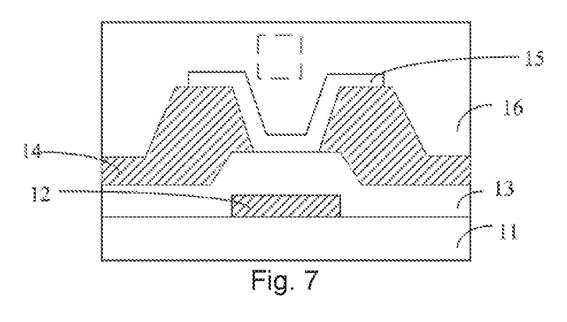
FIG. 7 is a partial cross-sectional view of a thin film transistor according to Embodiment 8 of the present disclosure.

As shown in FIG. 7, corresponding to the manufacturing method of a thin film transistor of Embodiment 2 of the present disclosure, Embodiment 8 of the present disclosure provides another thin film transistor, which is prepared by the manufacturing method of a thin film transistor of Embodiment 2 of the present disclosure. The thin film transistor is a fully transparent bottom gate structure carbon-based material thin film transistor. In FIG. 7, the substrate 11, the transparent bottom gate 12, the transparent gate insulating layer 13, the transparent source-drain 14, the transparent active layer 15, and the transparent passivation layer 16.

Corresponding to the manufacturing method of a thin film transistor of Embodiment 3 of the present disclosure. Embodiment 9 of the present disclosure provides yet another thin film transistor, which is prepared by the manufacturing method of a thin film transistor in Embodiment 3 of the present disclosure, which is a non-fully transparent double-gate structure carbon-based material thin film transistor.

Figure 8:
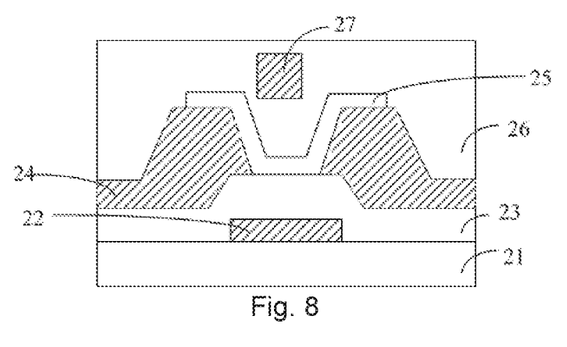
FIG. 8 is a partial cross-sectional view of another thin film transistor according to Embodiment 10 of the present disclosure.

As shown in FIG. 8, corresponding to the manufacturing method of the thin film transistor of Embodiment 4 of the present disclosure, Embodiment 10 of the present disclosure provides yet another thin film transistor, which is prepared by the manufacturing method of a thin film transistor of Embodiment 4 of the present disclosure, the thin film transistor is a fully transparent double-gate structure carbon-based material thin film transistor. In FIG. 8, substrate 21, transparent bottom gate 22, transparent gate insulating layer 23, transparent source-drain 24, transparent active layer 25, transparent passivation layer 26, transparent top gate 27.

Corresponding to the manufacturing method of a thin film transistor of Embodiment 5 of the present disclosure. Embodiment 11 of the present disclosure provides still another thin film transistor, which is prepared by the manufacturing method of a thin film transistor in Embodiment 5 of the present disclosure, which is a non-fully transparent top gate structure carbon-based material thin film transistor.

Figure 9:
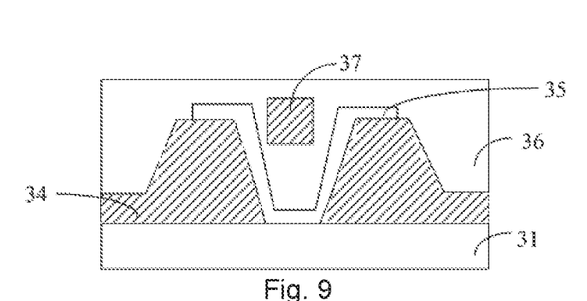
FIG. 9 is a partial cross-sectional view of the other thin film transistor according to Embodiment 12 of the present disclosure.

As shown in FIG. 9, corresponding to the manufacturing method of a thin film transistor of Embodiment 6 of the present disclosure, a further thin film transistor is provided of Embodiment 12 of the present disclosure, which is prepared by the manufacturing method of a thin film transistor of Embodiment 6 of the present disclosure. The thin film transistor is a fully transparent top gate structure carbon-based material thin film transistor. In FIG. 9, substrate 31, transparent source-drain 34, transparent active layer 35, transparent passivation layer 36, transparent top gate 37.

In summary, the present disclosure increases the two steps of ozone cleaning and oxygen plasma treatment on the conductive layers (i.e. the source-drain) of the metal oxide on the mature process and process of the existing amorphous silicon thin film transistor, improving the surface work function of the conductive metal oxide to make good ohmic contact with the active layer of the carbon material so as to improve the performance of the carbon-based thin film transistor device. Moreover, the present disclosure can be applied to the preparation of a non-transparent carbon-based material thin film transistor and also to the preparation of a fully transparent carbon-based material thin film transistor.

The foregoing disclosure is merely a preferred embodiment of the present disclosure, and certainly cannot be used to limit the scope of the present disclosure. Therefore, equivalent changes made according to the claims of the present disclosure are still within the scope of the present disclosure.

What is claimed is:

1. A manufacturing method of a thin film transistor, comprising:
   step S11, selecting a substrate, and forming a bottom gate, a gate insulating layer and a source-drain from bottom to top in sequence above the selected substrate, wherein the source-drain adopts a conductive metal oxide with an adjustable work function as a metal conducting electrode;
   step S12, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment; and
   step S13, forming a passivation layer over the active layer after the formation of the active layer is completed.

2. The method according to claim 1, wherein the step S11 specifically comprises:
   when a substrate made of a silicide is selected, depositing a layer of conductive metal oxide having a thickness of first threshold on the substrate made of the selected silicide by radio frequency magnetron sputtering as the bottom gate, and using plasma enhanced chemical vapor deposition to deposit a layer of silicon dioxide having a thickness of second threshold as the gate insulating layer;
   after the formation of the gate insulating layer above the substrate made of the selected silicide is completed, depositing a layer of the conductive metal oxide having a thickness of third threshold by magnetron sputtering as the source-drain, then preparing a source-drain pattern by coating photoresist, exposing, etching and removing photoresist.

3. The method according to claim 2, wherein the step S12 specifically comprises:
   soaking and flushing the source-drain of the substrate made by the selected silicide with acetone, methanol and isopropanol; drying the rinsed source-drain with a certain concentration of nitrogen; ozone cleaning the dried source-drain for 60 seconds under ultraviolet light; and bombarding the source-drain after the ozone cleaning by oxygen plasma for 60 seconds, before the active layer formed from semiconductor carbon nanotubes or silicon carbide is formed into a film;
   soaking the source-drain after the oxygen plasma bombardment into a semiconductor carbon nanotube solution or the silicon carbide solution, so that a layer of thin film deposited thereon is taken out and baked at a certain temperature to obtain a carbon nanotube network-like thin film or a silicon carbide network-like thin film; then coating the photoresist on the carbon nanotube network-like thin film or the silicon carbide network-like thin film, and etching remaining portions of the carbon nanotube network-like thin film or the silicon carbide network-like thin film except for a channel portion of a transistor with oxygen ions; continuing to remove the photoresist above the channel portion of the transistor in the carbon nanotube network-like thin film or the silicon carbide network-like thin film to prepare a carbon nanotube channel or a silicon carbide channel film, so that an active layer formed from semiconductor carbon nanotubes or silicon carbide is obtained.

4. The method according to claim 3, wherein the step S13 specifically comprises:
covering a certain thickness of silicon dioxide over the active layer made of semiconductor carbon nanotubes or silicon carbide by a chemical vapor deposition method as a passivation layer, after the formation of the active layer made of semiconductor carbon nanotubes or silicon carbide is completed.

5. The method according to claim 4, wherein the selected substrate is a transparent substrate made of quartz or glass, and a transparent bottom gate, a transparent gate insulating layer, a transparent source-drain, a transparent active layer and a transparent passivation layer are formed above the corresponding substrate; wherein
the transparent gate insulating layer and the transparent passivation layer are both made of a transparent insulating material consisting of silicon dioxide, graphene oxide, silicon nitride, aluminum oxide and an organic transparent insulating material;
the transparent bottom gate and the transparent source-drain are made of a transparent conductive metal oxide with an adjustable work function as a metal conducting electrode, and the transparent conductive metal oxide consists of indium tin oxide, aluminum zinc oxide, tin oxide fluoride, gallium zinc oxide and zinc tin oxide;
the transparent active layer is made of semiconductor carbon nanotube or silicon carbide.

6. The method according to claim 5, wherein the method further comprises:
depositing a layer of the transparent conductive metal oxide having a thickness of seventh threshold as a transparent top gate by RF magnetron sputtering.

7. A manufacturing method of a thin film transistor, comprising:
step S21, selecting a substrate, and forming a bottom gate, a gate insulating layer and a source-drain from bottom to top in sequence above the selected substrate, wherein the source-drain adopts a conductive metal oxide with an adjustable work function as a metal conducting electrode;
step S22, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment;
step S23, forming a passivation layer over the active layer after the formation of the active layer is completed;
wherein the step S21 specifically comprises:
placing a substrate made of a selected plastic in acetone and isopropanol, ultrasonic cleaning and then drying with nitrogen, when the substrate made of the plastic is selected;
forming a patterned photoresist on the selected plastic substrate by UV lithography and a conductive metal oxide with a thickness of fourth threshold deposited as the bottom gate by RF magnetron sputtering, patterning the bottom gate by de-photoresist, and then depositing a non-transparent insulating material with a thickness of fifth threshold as the gate insulating layer by atomic force deposition technique, and patterning the gate insulating layer through ultraviolet lithography and phosphoric acid wet-etching technology;
depositing a conductive metal oxide with a thickness of sixth threshold as the source-drain by magnetron sputtering, after the formation of the gate insulating layer above the substrate made of the selected plastic is completed, wet-etching an exposing indium tin oxide with phosphoric acid, after the photoresist is coated and the photoresist on the coating is patterned by UV lithography, and preparing a source-drain pattern by removing the photoresist of the unexposed conductive metal oxide.

8. The method according to claim 7, wherein the step S22 specifically comprises:
soaking and washing the source-drain of the substrate made of selected plastic with acetone, methanol and isopropanol, and drying the washed source-drain with a nitrogen gas of a certain concentration, and ozone cleaning the dried source-drain for 60 seconds under ultraviolet light, before the active layer formed from graphene is film-formed, bombarding the source-drain after the ozone cleaning with oxygen plasma for 60 seconds;
transforming a graphene grown on a copper foil by polymethylmethacrylate onto the source-drain after the oxygen plasma bombardment to form a thin film,
then coating the photoresist on the thin film formed by graphene and etching remaining portions of the thin film formed by graphene except for a channel portion of a transistor with oxygen ions, continuing to remove the photoresist above the channel portion of the transistor in the thin film formed by graphene, so that an active layer formed from graphene was obtained.

9. The method according to claim 8, wherein the step S23 specifically comprises:
covering a certain thickness of silicon dioxide by a chemical vapor deposition method on the active layer made of graphene as a passivation layer, after the formation of the active layer made of graphene is completed.

10. The method according to claim 9, wherein the selected substrate is a transparent substrate made of transparent plastic, and a transparent bottom gate, a transparent gate insulating layer, a transparent source-drain, a transparent active layer and a transparent passivation layer are formed above the corresponding substrate; wherein,
the transparent gate insulating layer and the transparent passivation layer are both made of a transparent insulating material consisting of silicon dioxide, graphene oxide, silicon nitride, aluminum oxide and an organic transparent insulating material;
the transparent bottom gate and the transparent source-drain are made of a transparent conductive metal oxide with an adjustable work function as a metal conducting electrode, and the transparent conductive metal oxide consists of indium tin oxide, aluminum zinc oxide, tin oxide fluoride, gallium zinc oxide and zinc tin oxide;
the transparent active layer is made of graphene.

11. The method according to claim 10, wherein the method further comprises:

depositing a transparent conductive metal oxide with a thickness of seventh threshold on the transparent passivation layer as a transparent top gate by RF magnetron sputtering.

12. A manufacturing method of a thin film transistor, comprising:
    step S31, selecting a substrate, and forming a source-drain on the selected substrate; wherein the source-drain adopts a conductive metal oxide with an adjustable work function as a metal conducting electrode;
    step S32, rinsing and drying the source-drain of the selected substrate, performing ozone cleaning to the dried source-drain for a predetermined time under a predetermined illumination condition, and bombarding the source-drain after the ozone cleaning with oxygen plasma for a period of time, and further forming an active layer made of a carbon material over the source-drain after the oxygen plasma bombardment; and
    step 33, sequentially forming a passivation layer and a top gate from bottom to top on the active layer, after the active layer is formed.

13. The method according to claim 12, wherein the step S31 specifically comprises:
    when a substrate made of silicide is selected, depositing a layer of the conductive metal oxide having a thickness of third threshold on the substrate made of silicide by magnetron sputtering as the source-drain, then preparing a source-drain pattern by coating photoresist, exposing, etching and removing photoresist.

14. The method according to claim 13, wherein the step S32 specifically comprises:
    soaking and flushing the source-drain of the substrate made by the selected silicide with acetone, methanol and isopropanol, drying the rinsed source-drain with a certain concentration of nitrogen, ozone cleaning the dried source-drain for 60 seconds under ultraviolet light, bombarding the source-drain after the ozone cleaning by oxygen plasma for 60 seconds, before the active layer formed from semiconductor carbon nanotubes or silicon carbide is formed into a film;
    soaking the source-drain after the oxygen plasma bombardment into a semiconductor carbon nanotube solution or the silicon carbide solution, so that a layer of thin film deposited thereon is taken out and baked at a certain temperature to obtain a carbon nanotube network-like thin film or a silicon carbide network-like thin film, then coating the photoresist on the carbon nanotube network-like thin film or the silicon carbide network-like thin film, and etching remaining portions of the carbon nanotube network-like thin film or the silicon carbide network-like thin film except for a channel portion of a transistor with oxygen ions, continuing to remove the photoresist above the channel portion of the transistor in the carbon nanotube network-like thin film or the silicon carbide network-like thin film to prepare a carbon nanotube channel or a silicon carbide channel film, so that an active layer formed from semiconductor carbon nanotubes or silicon carbide is obtained.

15. The method according to claim 14, wherein the step S33 specifically comprises:
    after the formation of the active layer made of semiconductor carbon nanotubes or silicon carbide is completed, covering a layer of silicon dioxide with a certain thickness over the active layer made of semiconductor carbon nanotubes or silicon carbide by a chemical vapor deposition method as a passivation layer, and using a radio frequency magnetron sputtering method to deposit a conductive metal oxide with a thickness of seventh threshold on the passivation layer as the top gate.

16. The method according to claim 15, wherein the selected substrate is a transparent substrate made of quartz or glass, and a transparent source-drain, a transparent active layer, a transparent passivation layer and a transparent top gate are formed above the corresponding substrate; wherein
    the transparent passivation layer is made of transparent insulating material, the transparent insulating material consists of silicon dioxide, graphene oxide, silicon nitride, aluminum oxide and organic transparent insulating material;
    the transparent source-drain adopts a transparent conductive metal oxide with an adjustable work function as a metal conducting electrode;
    the transparent active layer is made of semiconductor carbon nanotube or silicon carbide;
    the transparent top gate adopts a transparent conducting metal oxide with adjustable or non-adjustable work function as a metal conducting electrode;
    the transparent conductive metal oxide consists of indium tin oxide, aluminum zinc oxide, tin oxide, gallium zinc oxide, and zinc tin oxide.

17. The method according to claim 12, wherein the step S31 further comprises:
    when a substrate made of plastic is selected, depositing a layer of the conductive metal oxide having a thickness of third threshold on the substrate made of plastic by magnetron sputtering as the source-drain, then preparing a source-drain pattern by coating photoresist, exposing, etching and removing photoresist.

18. The method according to claim 17, wherein the step S32 further comprises:
    soaking and washing the source-drain of the substrate made of selected plastic with acetone, methanol and isopropanol, and drying the washed source-drain with a nitrogen gas of a certain concentration, and ozone cleaning the dried source-drain for 60 seconds under ultraviolet light, before the active layer formed from graphene is film-formed, bombarding the source-drain after the ozone cleaning with oxygen plasma for 60 seconds;
    transforming a graphene grown on a copper foil by polymethylmethacrylate onto the source-drain after the oxygen plasma bombardment to form a thin film,
    then coating the photoresist on the thin film formed by graphene and etching remaining portions of the thin film formed by graphene except for a channel portion of a transistor with oxygen ions, continuing to remove the photoresist above the channel portion of the transistor in the thin film formed by graphene, so that an active layer formed from graphene was obtained.

19. The method according to claim 18, wherein the step S33 further comprises:
    after the formation of the active layer made of graphene is completed, covering a layer of silicon dioxide with a certain thickness on the active layer made of graphene by a chemical vapor deposition method as a passivation layer, and using a radio frequency magnetron sputtering method to deposit a conductive metal oxide with a thickness of seventh threshold on the passivation layer as a top gate.

20. The method according to claim 19, wherein the selected substrate is a transparent substrate made of transparent plastic, and a transparent source-drain, a transparent active layer, a transparent passivation layer and a transparent top gate are formed above the corresponding substrate;
- the transparent passivation layer is made of transparent insulating material, the transparent insulating material consists of silicon dioxide, graphene oxide, silicon nitride, aluminum oxide and organic transparent insulating material;
- the transparent source-drain adopts a transparent conductive metal oxide with an adjustable work function as a metal conducting electrode;
- the transparent active layer is made of graphene;
- the transparent top gate adopts a transparent conducting metal oxide with adjustable or non-adjustable work function as a metal conducting electrode;
- the transparent conductive metal oxide consists of indium tin oxide, aluminum zinc oxide, tin oxide, gallium zinc oxide, and zinc tin oxide.

* * * * *